United States Patent
Shah et al.

(10) Patent No.: US 8,947,154 B1
(45) Date of Patent: Feb. 3, 2015

(54) METHOD AND SYSTEM FOR OPERATING GALLIUM NITRIDE ELECTRONICS

(71) Applicant: Avogy, Inc., San Jose, CA (US)

(72) Inventors: Hemal N. Shah, San Mateo, CA (US); Donald R. Disney, Cupertino, CA (US); Heratch Amirkhani Namagerdi, Glendale, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 14/045,708

(22) Filed: Oct. 3, 2013

(51) Int. Cl.
*H03K 17/687* (2006.01)

(52) U.S. Cl.
USPC .......................................... 327/430; 327/427

(58) Field of Classification Search
USPC .................................. 327/108, 427, 430, 434
See application file for complete search history.

(56) References Cited

U.S. PATENT DOCUMENTS

| | | | |
|---|---|---|---|
| 4,805,003 A | 2/1989 | Holm et al. | |
| 6,661,260 B2 * | 12/2003 | Nakahara et al. | 327/109 |
| 7,109,100 B2 | 9/2006 | Nakamura | |
| 7,355,223 B2 | 4/2008 | Harris et al. | |
| 7,592,647 B2 | 9/2009 | Nakata et al. | |
| 7,863,649 B2 | 1/2011 | Hikita et al. | |
| 7,875,538 B2 | 1/2011 | Matsuda | |
| 7,928,797 B2 * | 4/2011 | Valentian et al. | 327/537 |
| 8,466,017 B2 | 6/2013 | Sheridan et al. | |
| 2002/0003245 A1 | 1/2002 | Kato et al. | |
| 2009/0033405 A1 * | 2/2009 | Yanagishima | 327/427 |
| 2009/0267078 A1 | 10/2009 | Mishra et al. | |
| 2009/0269896 A1 | 10/2009 | Chen et al. | |
| 2010/0025730 A1 | 2/2010 | Heikman et al. | |
| 2010/0124814 A1 | 5/2010 | Arena | |
| 2010/0148186 A1 | 6/2010 | Sheridan et al. | |
| 2011/0210377 A1 | 9/2011 | Haeberien et al. | |
| 2013/0032814 A1 | 2/2013 | Bour | |
| 2013/0112985 A1 | 5/2013 | Kizilyalli | |
| 2013/0153963 A1 | 6/2013 | Shealy et al. | |

* cited by examiner

*Primary Examiner* — Quan Tra
(74) *Attorney, Agent, or Firm* — Kilpatrick Townsend & Stockton LLP (57) ABSTRACT

An electronic circuit comprising a driver and a main transistor are provided. The driver may include a bias voltage generator, a supplementary transistor, and an output driver. The bias voltage generator may be configured to receive a voltage input and generate a biased voltage output based on the voltage input. The supplementary transistor may have a gate coupled to the biased voltage output of the bias voltage generator, and a source of the supplementary transistor providing a current to the bias voltage generator. The output driver may be configured to receive the biased voltage output from the bias voltage generator and the voltage input, receive the voltage input, and output a drive voltage. The main transistor of the electronic circuit may have a gate, a coupled to the drive voltage, and a drain coupled to a drain of the supplementary transistor.

19 Claims, 5 Drawing Sheets

METHOD AND SYSTEM FOR OPERATING GALLIUM NITRIDE ELECTRONICS

BACKGROUND OF THE INVENTION

Power electronics are widely used in a variety of applications. Power electronic devices are commonly used in circuits to modify the form of electrical energy, for example, from AC to DC, DC to DC, and from one voltage level to another. Such devices can operate over a wide range of power levels, from milliwatts in mobile devices to hundreds of megawatts in high voltage power transmission systems, and at increasingly high frequencies for modern electronic applications. Despite the progress made in power electronics, there is a need in the art for improved electronics systems for achieving higher power conversion efficiencies and methods of operating the same.

SUMMARY OF THE INVENTION

The present invention relates generally to electronic devices. More specifically, the present invention relates to a transistor driver using gallium nitride (GaN) electronics. Merely by way of example, the invention has been applied to methods and systems for using a conventional insulated-gate bipolar transistor (IGBT) gate driver in conjunction with a GaN transistor driver and a GaN transistor. The methods and techniques can be applied to a variety of semiconductor devices, such as metal-oxide-semiconductor field-effect transistors (MOSFETs), bipolar transistors (BJTs, HBTs), diodes, and the like.

According to an embodiment of the present invention, an electronic device is provided. The electronic device can be an electronic circuit comprising a driver and a main transistor. The driver may include a bias voltage generator, a supplementary transistor, and an output driver. The bias voltage generator may be configured to receive a voltage input and generate a biased voltage output based on the voltage input. The supplementary transistor may have a gate, a drain, and a source, in which the gate of the supplementary transistor is coupled to the biased voltage output of the bias voltage generator, and the source of the supplementary transistor provide a current to the bias voltage generator. The output driver may be configured to receive the biased voltage output from the bias voltage generator and the voltage input, receive the voltage input, and output a drive voltage. The main transistor of the electronic circuit may have a gate, a drain, and a source, in which the gate of the main transistor is coupled to the drive voltage, and the drain of the main transistor is coupled to the drain of the supplementary transistor.

According to another embodiment of the present invention, a method of operating a GaN JFET is provided. The GaN JFET may receive an input voltage and generate a biased voltage output based on the input voltage. The method further includes monitoring a current of a supplementary transistor to provide a current value and receiving, at an output drive, the biased voltage output, the current value, and the input voltage. Additionally, the method may involve generating an output drive voltage based on the biased voltage output, the current value, and the input voltage, and providing, to the GaN JFET, the output drive voltage.

Numerous benefits are achieved by way of the present invention over conventional techniques. For example, embodiments of the present invention decrease the physical size of the power device because of the properties of using GaN devices as opposed to typical MOSFETs and BJTs. Some embodiments of the present invention achieve an increase in switching frequency and reduced heat through using a combination of advanced circuit topologies and state-of-the-art power devices made from GaN materials.

Furthermore, embodiments of the invention provide a co-packaged GaN driver and electronic devices that provide more cost-effective solutions than conventional techniques. For example, the GaN driver and transistor described herein co-package a GaN driver circuit and a transistor, such that only one electronic package is utilized. Co-packaging GaN devices also results in easier assembly of the electronic packages, less board space, and therefore less cost for the board and its enclosure. These and other embodiments of the present invention, along with many of its advantages and features, are described in more detail in conjunction with the text below and attached figures.

DETAILED DESCRIPTION OF SPECIFIC EMBODIMENTS

The present invention relates generally to electronic devices. More specifically, the present invention relates to a transistor driver using gallium nitride (GaN) electronics. Merely by way of example, the invention has been applied to methods and systems for using a conventional insulated-gate bipolar transistor (IGBT) gate driver in conjunction with a GaN transistor driver and a GaN transistor. The methods and techniques can be applied to a variety of semiconductor devices, such as metal-oxide-semiconductor field-effect transistors (MOSFETs), bipolar transistors (BJTs, HBTs), diodes, and the like.

GaN-based electronic devices are undergoing rapid development, and generally are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, $\mu$, is higher than competing materials for a given background doping level, N. This provides low resistivity, $\rho$, because resistivity is inversely proportional to electron mobility, as provided by equation (1):

$$\rho = \frac{1}{q\mu N}, \tag{1}$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \frac{\rho L}{A}, \quad (2)$$

where A is the cross-sectional area of the channel or current path.

An insulated-gate bipolar transistor (IGBT) is a three-terminal power semiconductor device that may be used as an electronic switch. Typically, IGBT devices are fabricated on silicon substrates and owing to the material properties of silicon (not being a wide bandgap semiconductor), a large thickness of silicon is needed to block a given reverse voltage across the device. Additionally owing to the much smaller mobility of silicon compared to GaN, large device areas are needed in order to achieve a certain current rating. This tends to consume a large surface area on the semiconductor, which in turn increases device capacitance and hence IGBTs can only be switched at slower frequencies<100 kHz to minimize switching losses Advantages in using IGBTs as electronic switches at lower frequencies includes high efficiency, which may be utilized in various electronic applications, including Variable-Frequency Drives (VFDs), electric cars, trains, variable speed refrigerators, air-conditioners and even stereo systems with switching amplifiers. In switching applications for modern electronic devices, the pulse repetition rates may reach frequencies at least ten times the highest audio frequency handled by an analog audio amplifier. Thus, with the advancement of modern electronics, the power applications for high-speed, low-power, and low-cost electronic switches may be greatly increased.

The superior properties of GaN can give rise to improved semiconductor devices, especially power switching semiconductor devices that utilized vertical architectures. Vertical semiconductor devices, in comparison with lateral devices, utilize a smaller surface area to achieve the same performance (i.e., forward current conduction capability) as lateral devices. Vertical semiconductor devices have electrical contacts on both the top surface of the semiconductor and on the bottom surface, or backside, such that current flows vertically between the electrical contacts. Vertical power devices are vertical semiconductor devices that can be utilized in high power and/or high voltage applications, such as power electronics.

IGBT circuits are typically driven by an IGBT driver. Embodiments of the present invention utilize conventional IGBT drivers to drive circuits utilizing GaN-based electronics. As described herein, the GaN transistor circuit provided according to embodiments of the present invention comprises a GaN JFET driver driving a main GaN JFET co-packaged together such that the GaN transistor circuit may be utilized in conjunction with an IGBT driver, effectively replacing a three-terminal IGBT. For a given voltage and current rating, GaN power devices may be significantly smaller and more compact than their silicon counterparts. For example, a 600 V, 5 A GaN power device may have a surface area that is 100 times smaller than a 600 V, 5 A silicon IGBT. Vertical GaN power devices may also be operated at much higher frequencies (e.g., 500 kHz-20 MHz) compared to silicon IGBTs (e.g., up to 100 kHz) without an increase in power loss. Embodiments of the present invention enable operation at high frequencies with increased performance and reduced switching losses.

The capacitance of a power semiconductor device generally scales with area, so GaN power devices generally have much lower capacitance than similarly rated silicon power devices. Package-related capacitance also scales with size, so the electronic package-related capacitance is also greatly reduced as a result of smaller package sizes associated with GaN circuits. These lower capacitances provide greatly reduced switching losses for GaN power devices in comparison to similarly rated silicon power devices. Due to their small size, GaN devices may be co-packaged closely together, and parasitic inductance, resistance, and capacitance associated with interconnections between devices may be substantially reduced as the interconnection (e.g., current path) between these devices is made through a highly-conductive leadframe. Reducing these parasitic inductances greatly reduces electromagnetic interference (EMI), especially at high switching frequencies, and also reduces the over-voltage stress on the power semiconductor devices and other power electronic circuit elements. As a result, power electronics according to embodiments of the invention provide benefits and advantages such as faster switching, lower power loss, and less EMI than achieved with conventional approaches.

Figure 1:
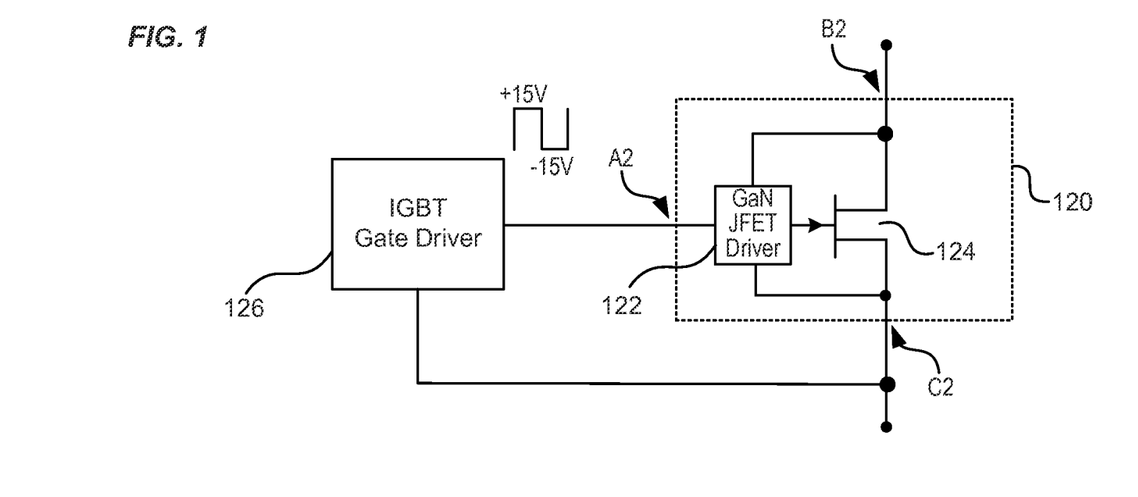
FIG. 1 is a simplified schematic diagram of an IGBT Gate Driver in conjunction with a GaN transistor circuit according to an embodiment of the present invention.

FIG. 1 is a simplified schematic diagram of an IGBT Gate Driver in conjunction with a GaN transistor circuit according to an embodiment of the present invention. As illustrated in FIG. 1, an IGBT gate driver 126 is used to drive a three-terminal GaN transistor circuit 120, including a GaN JFET driver 122, and a GaN JFET 124 (which may also be referred to as a main JFET). The GaN transistor circuit 120 comprises three terminals that correspond to the three terminals that would be provided by a conventional IGBT. The three-terminal GaN transistor circuit 120 comprises three terminals: A2 at the input of the GaN JFET driver 122 (which is coupled to the gate node of JFET 124), B2 at the drain node of JFET 124, and C2 at the source node of JFET 124. Processes for the fabrication of a vertical GaN transistor suitable for use as GaN JFET 124 are provided in commonly assigned U.S. Patent Application Publication No. 2013/0112985, published on May 9, 2013, the disclosure of which is hereby incorporated by reference.

Examples of device structures that can be utilized in GaN JFET 124, which can also be referred to as a GaN power transistor, include a first gallium nitride layer that is coupled to a substrate. In some embodiments, the substrate is a gallium nitride substrate. In some embodiments, first gallium nitride layer can include an epitaxially grown gallium nitride layer, e.g., GaN that has n-type conductivity. First gallium nitride layer can serve as a drift region and therefore can be a relatively low-doped material. For example, first gallium nitride layer can have an n-conductivity type, with dopant concentrations ranging from $1 \times 10^{14}$ cm$^{-3}$ to $1 \times 10^{18}$ cm$^{-3}$. Furthermore, the dopant concentration can be uniform, or can vary, for example, as a function of the thickness of the drift region. In some embodiments, n-type dopants can include silicon, oxygen, selenium, tellurium, or the like.

The thickness of first gallium nitride layer can also vary substantially, depending on the desired functionality. Homoepitaxial growth can enable first gallium nitride layer to be grown far thicker than heteroepitaxial GaN layers formed on non-GaN substrates. Thicknesses can vary between 0.5 µm and 100 µm, for example. In some embodiments thicknesses are greater than 5 µm. Resulting parallel plane breakdown voltages for GaN power transistor can vary depending on the embodiment. Some embodiments provide for breakdown voltages of at least 100 V, 300 V, 600 V, 1.2 kV, 1.7 kV, 3.3 kV, 5.5 kV, 13 kV, or 20 kV.

A second gallium nitride layer can be epitaxially grown over the first gallium nitride layer. The second gallium nitride layer, from which edge termination structures may be eventually formed, can have a conductivity type different than first gallium nitride layer. For instance, if first gallium nitride layer is formed from an n-type GaN material, second gallium nitride layer may be formed from a p-type GaN material, and vice versa. In some embodiments, second gallium nitride layer is used to form the edge termination structures and is a continuous regrowth over portions of first gallium nitride layer with other portions of the structure, such as regions of other semiconductor devices, characterized by reduced or no growth as a result of the presence of a regrowth mask (not shown). One of ordinary skill in the art would recognize many variations, modifications, and alternatives.

The thickness of second gallium nitride layer can vary, depending on the process used to form the layer and the device design. In some embodiments, the thickness of second gallium nitride layer 108 is between 0.1 µm and 5 µm.

Second gallium nitride layer can be highly doped, for example in a range from about $5 \times 10^{17}$ cm$^{-3}$ to about $1 \times 10^{19}$ cm$^{-3}$. Additionally, as with other epitaxial layers, the dopant concentration of second gallium nitride layer can be uniform or non-uniform as a function of thickness. In some embodiments, the dopant concentration increases with thickness, such that the dopant concentration is relatively low near first gallium nitride layer and increases as the distance from first gallium nitride layer increases. Such embodiments provide higher dopant concentrations at the top of second gallium nitride layer where metal contacts can be subsequently formed. Other embodiments utilize heavily doped contact layers to form Ohmic contacts.

One method of forming the second gallium nitride layer, and other layers described herein, can be through a regrowth process that uses an in-situ etch and diffusion preparation processes. These preparation processes are described more fully in U.S. Patent Application Publication No. 2013/0032814, published on Feb. 7, 2013, the disclosure of which is hereby incorporated by reference in its entirety. The second gallium nitride layer can be used to form the gate region of the vertical GaN power transistor.

The second gallium nitride layer/gate region can include a continuous region and one or more finger-like projections. Together, the continuous region and projections form the gate region of the GaN vertical power transistor. A gate electrode is disposed over continuous region and coupled to gate region via gate contacts. In some embodiments, gate electrode can include metals such as scandium, nickel, platinum, palladium, silver, gold, copper, aluminum, etc. and alloys thereof. In some embodiments, gate electrode can be a multi-layered structure.

In one embodiment, at least some portions of the gate region may also include a low resistance layer that may be disposed on top of the second gallium nitride layer. This low resistance layer may include a metal such as scandium, platinum, palladium, nickel, or other suitable materials. The purpose of this layer is to reduce the lateral resistance from gate electrode to various locations on the gate region, which may be advantageous to reduce the distributed gate resistance of vertical power transistor and, thus, improve the switching performance.

Although some embodiments are discussed in terms of a GaN substrate, embodiments of the present invention are not limited to GaN substrates. Other III-V materials, in particular, III-nitride materials, are included within the scope of the present invention and can be substituted not only for the illustrative GaN substrate, but also for other GaN-based layers and structures described herein. As examples, binary III-V (e.g., III-nitride) materials, ternary III-V (e.g., III-nitride) materials such as InGaN and AlGaN, and quaternary III-V (e.g., III-nitride) materials such as AlInGaN are also included within the scope of the present invention.

The GaN power transistor may utilize an n-type drift layer that is grown on top of an n-type substrate. However, the present invention is not limited to this particular configuration. In other embodiments, substrates with p-type doping can be utilized. Additionally, embodiments can use materials having an opposite conductivity type to provide devices with different functionality. Thus, although some embodiments described herein include n-type GaN epitaxial layer(s) doped with silicon, other n-type dopants may be used, such as Ge, Se, S, O, Te, and the like. In other embodiments, highly or lightly doped material, p-type material, material doped with dopants such as Mg, Ca, Be, and the like can also be used. The substrates discussed herein can include a single material system or multiple material systems including composite structures of multiple layers. One of ordinary skill in the art would recognize many variations, modifications, and alternatives.

A key feature of the present invention is that a GaN JFET can be driven directly by a conventional IGBT Gate Driver 126. Large selections of IGBT gate drivers are commercially available and widely used to drive silicon IGBTs. The present invention provides a three-terminal replacement for a silicon IGBT that can be directly driven by a standard IGBT Gate Driver with no need for any additional circuitry.

In FIG. 1, at node A2, an input voltage is received from the IGBT Gate Driver 126. This input voltage may be any standard voltage waveform that is generated by the IGBT Gate Driver 126. By way of example, the input voltage may be a square wave with a low level of −15V and a high level of +15V. Because the construction of a GaN JFET may be different than the construction of a conventional silicon-based transistor, there may be a limitation on how much voltage that can be applied to the gate node of the GaN JFET 124.

In a typical IGBT circuit, the gate of the IGBT may be capable of handling high voltage (e.g., +15/−15 V) input from the IGBT gate driver. According to embodiments of the present invention, the gate node of the JFET 124 may be limited to a voltage range that may be smaller than the output of IGBT gate driver 126. For example, the allowed input voltage range of GaN JFET 124 may be from −3V to +3V. Thus, existing IGBT gate drivers may not be suitable for use in driving GaN JFET 124. Accordingly, embodiments of the present invention utilize GaN JFET driver 122 to facilitate use of an IGBT gate driver 126 with GaN JFET 124.

Figure 2:
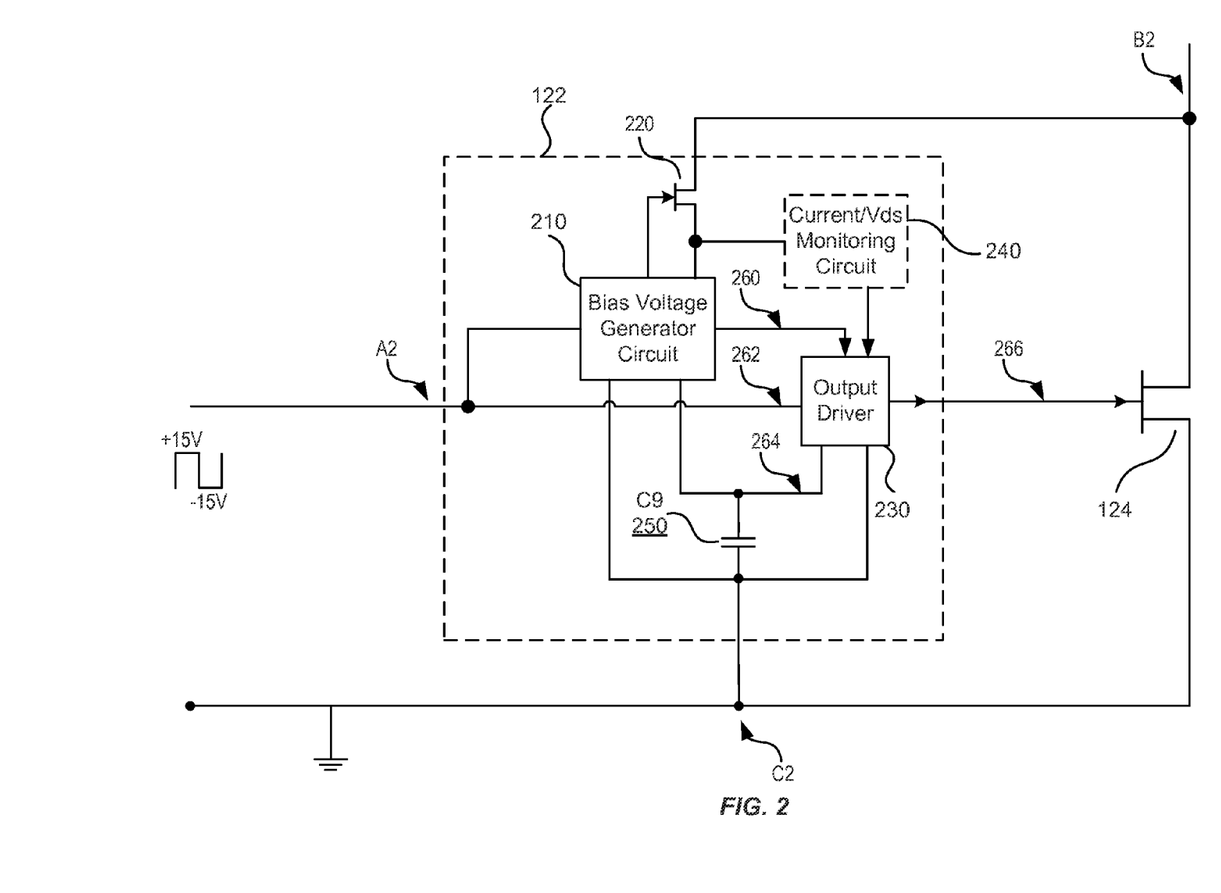
FIG. 2 is a simplified schematic diagram illustrating elements of a GaN transistor circuit according to an embodiment of the present invention.

FIG. 2 is a simplified schematic diagram illustrating elements of a GaN transistor circuit according to an embodiment of the present invention. Referring to FIG. 2, the GaN JFET driver 122 may include several components. The GaN JFET driver 122 may include a bias voltage generator circuit 210, a supplementary JFET transistor 220, and output driver 230. In some embodiments of the invention, the GaN JFET driver 122 may include a current/$V_{ds}$ (drain to source voltage) monitoring circuit 240 to monitor the drain to source current and voltage of the supplementary transistor 220. According to embodiments of the invention, the supplementary transistor 220 may be a GaN JFET transistor. In another embodiment, the supplementary transistor 220 can be a silicon JFET.

The drain of the main GaN JFET 124 can be tied to the drain of the supplementary transistor 220. At node 260 and 264, high and low gate drive levels, respectively, are generated by the bias voltage generator circuit 210 and coupled to the output driver 230. In one embodiment, the high and low gate drive levels may be +3V and −3V, respectively. The output driver 230 also receives the power signal from the external IGBT gate driver at node 262, which is also one of the three terminals, A2, of the three terminal GaN transistor circuit 120. As such, an output voltage from the IGBT driver 126 of FIG. 1(b), e.g., a +15/−15 V signal, may be also fed as an input to the output driver 230.

The input voltage at node 262 (e.g. +15/−15 V) can act as a timing signal to the output driver 230 to generate a reduced voltage (e.g. +3/−3 V) output at node 266 to the gate of main JFET 124. Thus, an output drive voltage from the output driver may be characterized by a lower amplitude than the input voltage. Since the drain of the supplementary transistor 220 is tied to the drain of the main transistor 124, the output driver 230 is powered by the voltage present on the drain terminal B2 of JFET 124. Therefore, GaN transistor circuit 120 does not require a separate power terminal, so it can be realized with only three terminals.

Referring to FIG. 2, an example optional current/$V_{ds}$ monitoring circuit 240 is illustrated. The current monitoring circuit 240 may monitor the current through main JFET 124 and provide a control signal to output driver 230 which can then provide overcurrent protection for main JFET 124. The current monitoring circuit 240 is coupled to the source of the supplementary transistor 220. When the voltage on the drain of the main JFET 124 is lower than the pinch-off voltage of supplementary JFET 220 (e.g. 20-40V), and there is little current flow through supplemental JFET 220 (e.g. less than 1 mA), the voltages at the drain and the source of the supplemental JFET 220 are almost the same. Therefore, the voltage on the source of supplemental JFET tracks the drain voltage of the main JFET 124, which is related to the current through main JFET 124 by the on-resistance of main JFET 124.

The voltage on the source of supplemental JFET 220 thus represents the current flowing through JFET 124 and serves as an input to current monitoring circuit 240. In one embodiment, current monitoring circuit 240 may comprise a circuit that compares the voltage on the source of supplemental JFET 220 with a predetermined reference voltage and provides a signal to output driver 230 when the source voltage exceeds the reference voltage (signifying that the current flowing through main JFET 124 has exceeded a predetermined value). Output driver 230 may then turn off the main JFET 124 to provide a current limit function. In some embodiments there may be a capacitor 250 to operatively couple the bias voltage generator circuit 210 and output driver 230 to ground at terminal C2.

Figure 3:
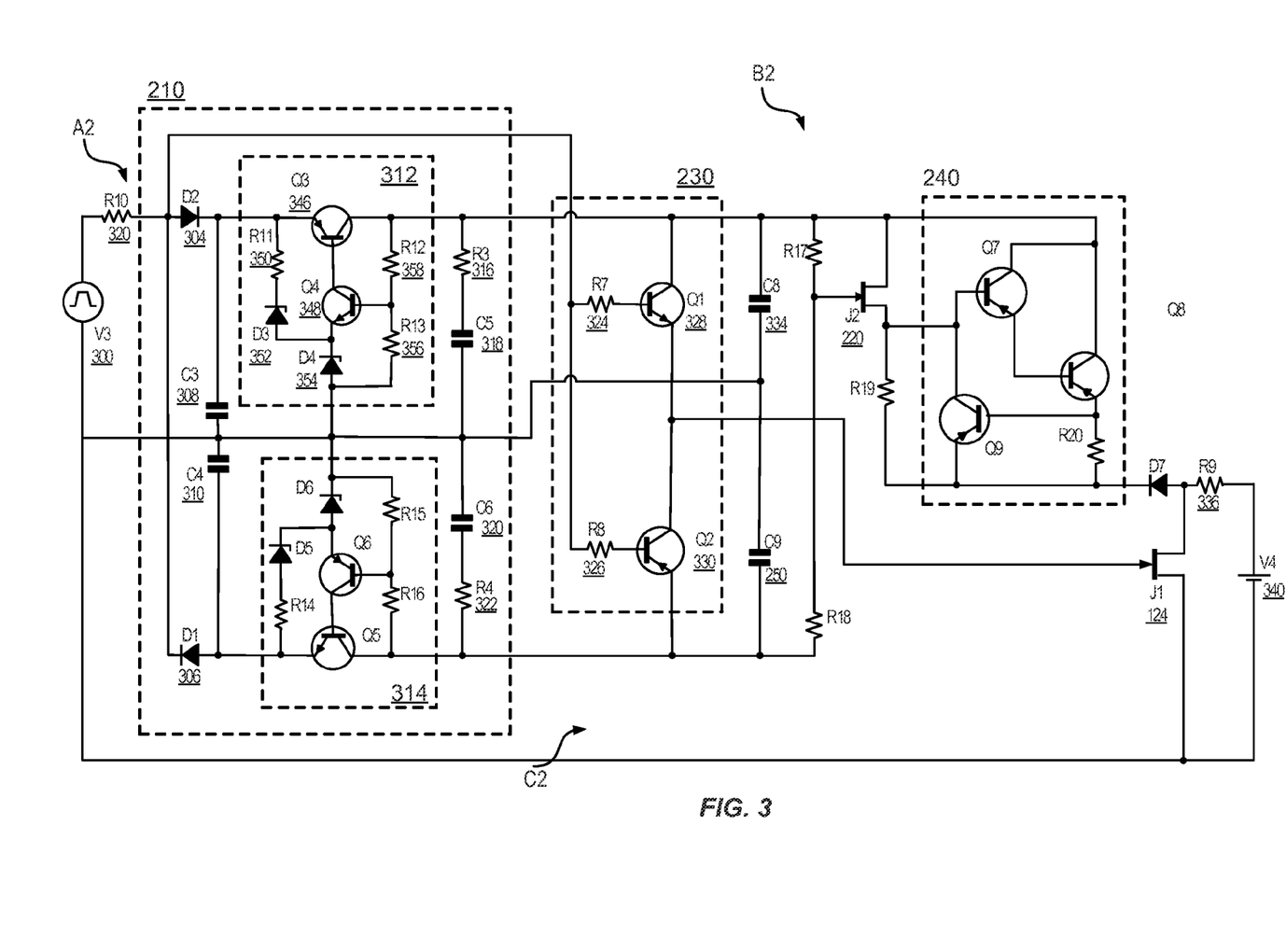
FIG. 3 is an exemplary schematic diagram illustrating devices suitable for use in elements of a GaN transistor circuit according to an embodiment of the present invention.

FIG. 3 is an exemplary schematic diagram illustrating devices suitable for use in elements of a GaN transistor circuit according to an embodiment of the present invention. In the embodiment shown in FIG. 3, the current monitoring circuit 240 of FIG. 2 is optional as illustrated. In FIG. 3, the bias voltage generator circuit 210 may receive an input voltage from a voltage source V3 300, which may be a pulse signal of +15/−15 V. The pulse voltage source V3 300 may be coupled in series with a resistor R10 302 which is typical 100 ohms. The bias voltage circuit 210 shown may be comprised of diode D1 306 and diode D2 304 in parallel with each other and further operatively coupled to in series with capacitor C3 308 and capacitor C4 310. For example, C3 308 and C4 310 may have a capacitance of 2 nF each.

The bias voltage generator circuit 210 may also comprise a linear voltage regulators 312 and 314 as shown in FIG. 3. The linear voltage regulator 312 is a positive voltage regulator, giving a +5V output when input voltage is between +7V and +15V. The positive voltage regulator 312 may include a BJT Q3 346 and BJT Q4 348. Additionally, the positive linear voltage regulator 312 can include resistors R11 350, R12 348, and R13 350, each with a value of 1 kΩ, for example. Zener diodes may also be included, for example Zener diodes D3 352 with a breakdown voltage of 5.1 V and D4 354 with a breakdown voltage of 2.5 V. Zener diodes can operate like ideal diodes in allowing current to flow from the anode to the cathode, but unlike ideal diodes, Zener diodes have a breakdown voltage at which current is allowed to flow in a reverse direction.

Linear voltage regulator 314 is a negative voltage regulator, giving a −5V output when input voltage is between −7V and −15V. The negative voltage regulator 314 may include a BJT Q5 362 and BJT Q6 364. Other elements in the negative linear voltage regulator 314 can also include resistors R14 368, R15 372, and R16 370, each with a value of 1 kΩ, for example. Zener diodes may also be included the negative linear voltage regulator 314, for example Zener diodes D5 366 with a breakdown voltage of 5.1 V and D6 364 with a breakdown voltage of 2.5 V. Additionally, the bias voltage circuit 210 may include resistors R3 316 and R4 322, each having a resistance of, for example, 10 mΩ. Each resistor may be in series with a capacitor. Resistor R3 316 may be in series with capacitor C5 318, having an exemplary value of 10 nF. Resistor R4 322 may be in series with capacitor C6 320, having an exemplary value of 10 nF. Accordingly, the bias voltage generator circuit 210 receives a pulse signal and biases the voltage to a lower pulse signal; for example, the bias voltage generator circuit 210 may receive an input pulse signal from voltage source V3 300 of +15/−15 V and generate an output of +5/−5 V.

Coupled to the bias voltage generator circuit 210 to receive the biased output voltage (e.g., +5/−5 V) may be an output driver circuit 230. The output driver circuit 230 may include two BJT transistors 328 and 330. The input pulse signal from voltage source 300 can be coupled to the gates of transistors 328 and 330 via resistors 324 and 326, respectively. Resistors 324 and 326 may be exemplary values of 10Ω each. The BJTs 328 and 330 may be coupled in series, with the drain of BJT 328 coupled to the +5 V of the biased output voltage from the bias voltage generator circuit 210, and the drain of BJT 330 may be coupled to the −5 V of the biased output voltage from the bias voltage generator circuit 210.

Outside of the output driver circuit 230, a capacitor C8 334 with an exemplary value of 100 nF may ground the drain of BJT 330. The drain of BJT 328 may be grounded via capacitor 334. Capacitor C8 334 can serve as a bypass capacitor, providing low impedance for the driver voltages during switching. Bypass capacitors can also include low equivalent series resistance (ESR) ceramic capacitors.

In an example, capacitor 334 may have a value of 100 nF. The output driver 230 may generate an output from the source of BJT 328 and the source of BJT 320. Thus, BJT 328 and BJT 320 may alternate in turning on and off to generate the output driver 230 output signal that pulses +5/−5 V. Additionally, there may be a current/$V_{ds}$ monitoring circuit 240 to monitor the drain to source current and voltage of a supplementary transistor 220. According to embodiments of the invention, the supplementary transistor 220 may be a GaN JFET transistor. Resistors R17 374 may be coupled in series with resistor R18 to provide a voltage the gate of supplementary transistor 220. Example values of the resistors R17 374 and R18 376 may be around 100 kΩ.

The current monitoring circuit 240 is coupled to the source of the supplementary transistor 220, and can include BJT Q7 380, BJT Q8 384, and BJT Q9 381. Additionally, the current monitoring circuit 240 can include resistor R20 386, with an example value of 5.2Ω. Therefore, the voltage on the source of supplemental JFET tracks the drain voltage of the main JFET 124, which is related to the current through main JFET 124 by the on-resistance of main JFET 124. The voltage on the source of supplemental JFET 220 thus represents the current flowing through JFET 124 and serves as an input to current monitoring circuit 240. The source of supplementary transistor 220 may be coupled to resistor R19 378, having an example value of 1 MΩ.

The generated output from output driver 230 can be coupled to the gate of main JFET 124. The drain of main JFET 124 may be coupled to a direct current (DC) voltage source 340 via resistor 336. The drain of main JFET 124 may be coupled to the current monitoring circuit 240 via a diode D7 388 to prevent current from flowing in the wrong direction. The resistor 336 may have an exemplary value of 200Ω. The voltage source 340 may output a DC voltage of 400 V, for example.

In embodiments of the invention, an electronic circuit comprising a GaN JFET transistor 124 and a GaN JFET driver 122 may be integrated in the same package. However, they may not be comprised of the same material or on the same die.

The GaN JFET driver 122 of the present invention has several advantages and benefits. For example, because of characteristics of the GaN JFET driver 122, a certain voltage amplitude may be received as an input (e.g., +15/–15 V) and then a different voltage amplitude is generated as an output (e.g., +5/–5 V). Accordingly, the GaN JFET driver 122 may operate a voltage converter that is self-driven since it can operate without an external power supply. The GaN JFET driver 122 may be driven off the voltage that is given to the gate and the drain of the main JFET 124, thereby eliminating the need for an external power supply.

Voltage converter circuits can be configured in a buck topology utilizing external inductors, capacitors and other components. However, in embodiments of the present invention, the voltage converter circuits, for example, the bias voltage generator circuit 210 and output driver circuit 230, can be configured as integrated circuits that use the power from the drain of the GaN JFET 124 to power the GaN JFET driver 122. As a result, embodiments of the present invention reduce or eliminate the number of power supplies utilized as well as, potentially, other external components.

Figure 5:
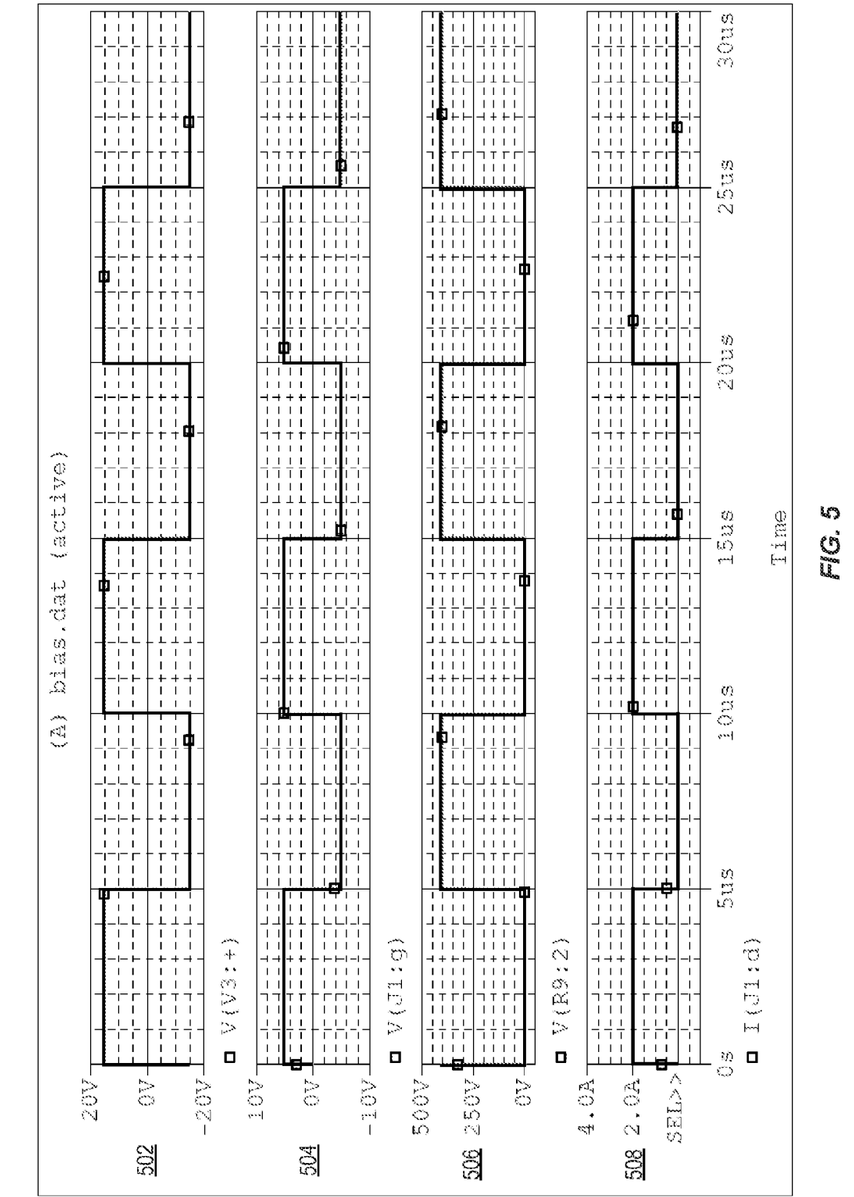
FIG. 5 illustrates the behavior of the exemplary schematic diagram of FIG. 3 according to an embodiment of the invention.

FIG. 5 illustrates an exemplary simulation of the circuit shown in FIG. 3. The graph at 502 shows the input pulse voltage of voltage source V3 300. As can be seen, the input voltage V3 300 is pulsed between +15 V and –15 V. 504 shows the gate voltage of the main JFET 124, and in the simulation example, pulses between +5 V and –5 V. 506 shows the voltage across the drain to source of main JFET 124. In this example, the Vds of main JFET 124 shown in graph 506 pulses between 0 V and 400 V. Graph 508 shows the drain to source current of the main JFET 124 (Ids), which is shown to alternate between 0 A and 2 A.

Figure 4:
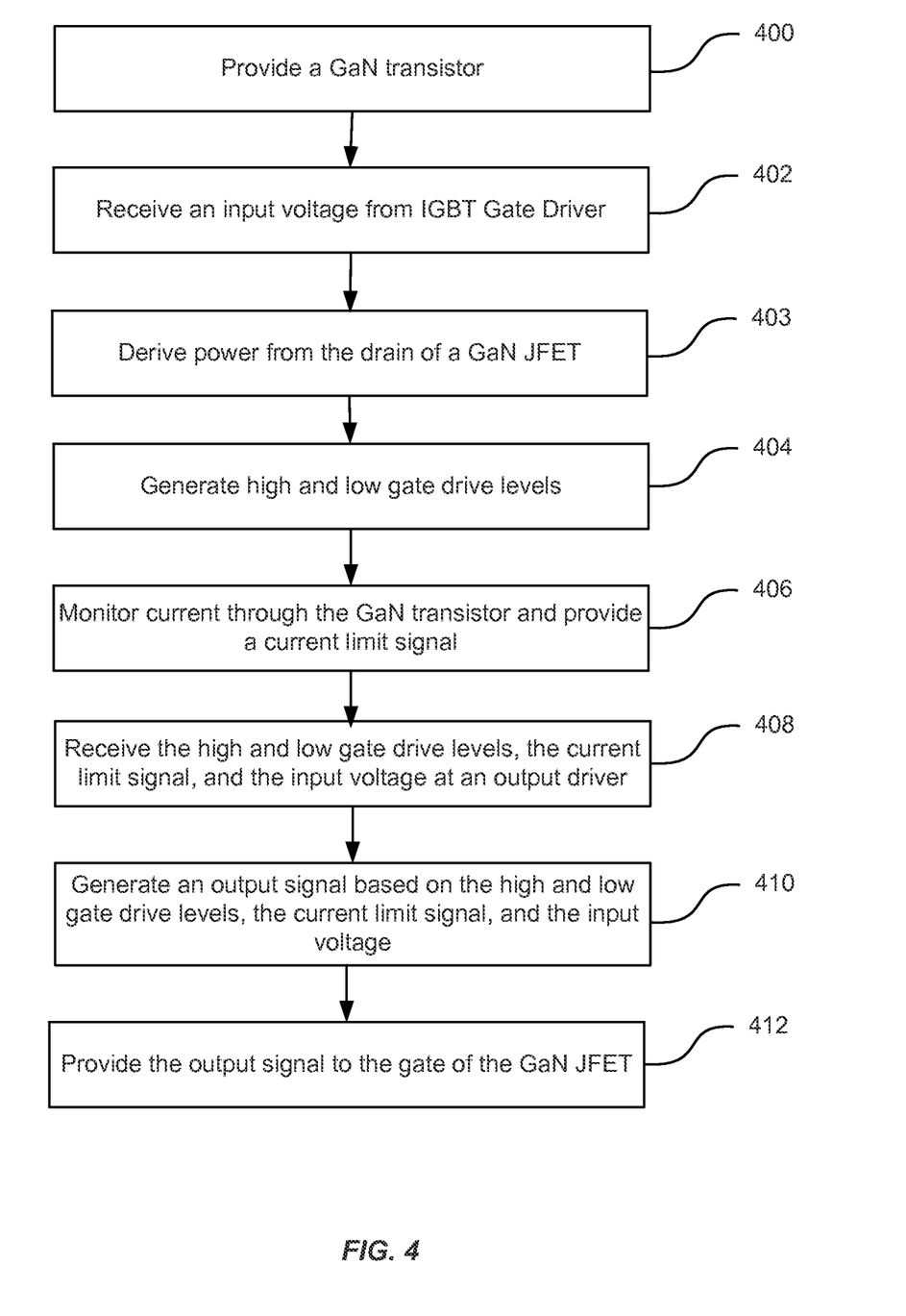
FIG. 4 is a simplified flowchart illustrating a method of using an IGBT gate driver in conjunction a GaN transistor according to an embodiment of the present invention.

FIG. 4 is a simplified flowchart illustrating a method of operating an IGBT gate driver in conjunction with a GaN transistor according to an embodiment of the present invention. As illustrated, the electronic circuits discussed herein enable GaN electronics to be utilized as drop-in replacements for IGBTs. The method of operating a GaN JFET can include providing the GaN JFET at 400, and receiving an input voltage from an IGBT gate driver, as shown at 402. The input voltage can be a pulsed input voltage, for example, +15/–15 V. The method can also include, at 403, deriving power from the drain terminal of the GaN transistor and generating high and low gate drive levels as shown at 404.

The high and low gate drive levels are generated by a bias voltage generator circuit in a GaN JFET driver. The GaN JFET driver may include a supplementary transistor coupled to the bias voltage generator circuit, further coupled to an output driver. The biased input voltage may be in a smaller range or amplitude than the input voltage, for example, +3/–3 V, which is within the safe operating range of the gate of the GaN JFET.

In other embodiments, a current monitoring circuit may be coupled to the supplementary transistor and the output driver. Accordingly, the method can include, as shown at 406, monitoring a current through the GaN transistor and providing a current limit signal when the current exceeds a predetermined value. In some embodiments, the supplementary transistor may be a GaN FET.

The method can further include receiving, at an output driver, the high and low gate drive levels, the current limit signal, and the input voltage at 408. These inputs are used by the output driver to generate an output signal.

In 410, the method may also comprise generating an output signal based on the high and low gate drive levels, the current limit signal, and the input voltage. The output signal from the output driver can then be used to drive the gate of the GaN transistor (e.g., JFET) by providing the output signal to the gate of the GaN JFET, as in 412. The output drive voltage can be characterized by a lower amplitude than the input voltage. For example, the output drive voltage can be +3/–3 V compared to +15/–15 V of the input voltage.

In some embodiments, the method may further comprise packaging the driver and the main transistor in a same package. The driver and the main transistor can be co-packaged on different dies. For example, the GaN JFET driver and the main JFET transistor may be co-packaged together, but on different dies.

It should be appreciated that the specific steps illustrated in FIG. 4 provide a particular method of operating a GaN transistor circuit according to an embodiment of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An electronic circuit comprising:
   a driver comprising:
      a bias voltage generator configured to receive a voltage input and generate a biased voltage output based on the voltage input;
      a supplementary transistor having a gate, a drain, and a source, wherein:

the gate of the supplementary transistor is coupled to the biased voltage output of the bias voltage generator; and the source of the supplementary transistor provides a current to the bias voltage generator; and an output driver configured to:
receive the biased voltage output from the bias voltage generator and the voltage input;
receive the voltage input; and
output a drive voltage; and a main transistor having a gate, a drain, and a source, wherein:
the gate of the main transistor is coupled to the drive voltage; and
the drain of the main transistor is coupled to the drain of the supplementary transistor.

2. The electronic circuit of claim 1, wherein the supplementary transistor is a GaN transistor, such that:
the drain of the supplementary transistor comprises a GaN substrate and a drain contact;
the source of the supplementary transistor is separated from the GaN substrate by a drift region and comprises a source contact;
the drift region of the supplementary transistor comprises a first GaN epitaxial layer coupled to the GaN substrate; and
the gate of the supplementary transistor comprises a second GaN epitaxial layer coupled to the first GaN epitaxial layer and a gate contact coupled to the biased voltage output of the bias voltage generator.

3. The electronic circuit of claim 1, the driver further comprising a current monitor configured to detect a current from the drain to the source of the supplementary transistor and output a regulated current, wherein the output driver further is configured to receive the regulated current from the current monitor.

4. The electronic circuit of claim 1 wherein the current monitor regulates the current from the drain of the supplementary transistor to the source of the supplementary transistor.

5. The electronic circuit of claim 1 wherein the supplementary transistor and the main transistor are junction gate field-effect transistors (JFET).

6. The electronic circuit of claim 1 wherein the output driver is a voltage converter.

7. The electronic circuit of claim 6 wherein the driver is driven by a voltage at the drain of the main transistor.

8. The electronic circuit of claim 1 wherein the driver and the main transistor are co-packaged in a same package.

9. The electronic circuit of claim 8 wherein the driver and the main transistor are on different dies.

10. The electronic circuit of claim 9 wherein the main transistor is a GaN JFET.

11. A method of operating a GaN JFET, the method comprising:
receiving, at a GaN JFET driver, an input voltage;
generating a biased voltage output based on the input voltage;
monitoring a current of a supplementary transistor to provide a current value;
receiving, at an output driver, the biased voltage output, the current value, and the input voltage;
generating an output drive voltage based on the biased voltage output, the current value, and the input voltage; and
providing, to the GaN JFET, the output drive voltage.

12. The method of claim 11 wherein the input voltage comprises a pulsed input voltage.

13. The method of claim 11 wherein the current value is based on the current from the drain to the source of the supplementary transistor.

14. The method of claim 11 wherein the output drive voltage is characterized by a lower amplitude than the input voltage.

15. The method of claim 11 wherein the supplementary transistor comprises a GaN FET.

16. The method of claim 11 wherein the output drive voltage is generated by a voltage converter.

17. The method of claim 16 wherein the voltage converter is driven by a voltage at a drain of the main transistor.

18. The method of claim 11 further comprising packaging the driver and the main transistor in a same package.

19. The method of claim 18 wherein the driver and the main transistor are on different dies.

* * * * *